(12) United States Patent
Tang et al.

(10) Patent No.: US 7,981,726 B2
(45) Date of Patent: Jul. 19, 2011

(54) COPPER PLATING CONNECTION FOR MULTI-DIE STACK IN SUBSTRATE PACKAGE

(75) Inventors: John J. Tang, Shanghai (CN); Henry Xu, Shanghai (CN); Jianmin Li, Shanghai (CN); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 1086 days.

(21) Appl. No.: 11/301,606

(22) Filed: Dec. 12, 2005

(65) Prior Publication Data

US 2007/0132082 A1    Jun. 14, 2007

(51) Int. Cl.
*H01L 21/00* (2006.01)

(52) U.S. Cl. ......... 438/109; 438/74; 438/107; 438/618; 257/685; 257/686; 257/774; 257/E23.141; 257/E23.145; 257/E25.013

(58) Field of Classification Search ............... 438/109, 438/687, 74, 107, 128, 618; 257/685, 686, 257/774, E23.011, E23.067, E23.141, E23.145, 257/E25.006, E25.013, E25.021, E25.027
See application file for complete search history.

(56) References Cited

U.S. PATENT DOCUMENTS

| 6,235,554 | B1 * | 5/2001 | Akram et al. | 438/109 |
| 6,750,547 | B2 * | 6/2004 | Jeung et al. | 257/778 |
| 7,112,815 | B2 * | 9/2006 | Prall | 257/2 |
| 2009/0217518 | A1 * | 9/2009 | Hiroshi et al. | 29/832 |

* cited by examiner

*Primary Examiner* — Matthew C Landau
*Assistant Examiner* — Colleen E Snow
(74) *Attorney, Agent, or Firm* — Kathy J. Ortiz (57) ABSTRACT

An embodiment of the present invention is a technique to construct a multi-die package. A stack of dice is formed from a base substrate in a package. The dice are positioned one on top of another and have copper plated segments for die interconnection. The dice are interconnected using copper plating to connect the copper plated segments.

5 Claims, 9 Drawing Sheets

COPPER PLATING CONNECTION FOR MULTI-DIE STACK IN SUBSTRATE PACKAGE

BACKGROUND

1. Field of the Invention

Embodiments of the invention relate to the field of semiconductor, and more specifically, to semiconductor manufacturing or fabrication.

2. Description of Related Art

In packaging process, the substrate manufacturing and the assembly manufacturing are separate. Current packaging in industry uses wire bonding or flip-chip (FC) technology for interconnection. Although wire bonding and FC technologies are popular, they do not provide adequate solutions for many packaging problems, such as multi-die stack.

The separate substrate and assembly manufacturing processes as used in current packaging technology may also have a number of disadvantages. First, the overall manufacturing costs and throughput may be high due to the wire bonding, molding, and other assembly tasks. Second, package parasitic inductance, resistance, and capacitance may be large, leading to performance degradation. Third, die interconnections may be long, causing high signal latency and therefore reducing the operating frequency.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to construct a multi-die package. A stack of dice is formed from a base substrate in a package. The dice are positioned one on top of another and have copper plated segments for die interconnection. The dice are interconnected using copper plating to connect the copper plated segments.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to form a stack of dice in a package. The stack of dice is formed from a number of layers. In each layer, a die is attached to a corresponding copper plated substrate. The die and the substrate are interconnected in one step at the same time for each layer using copper plating. Normal processes are used in the packaging process, leading to low cost because existing equipment or processes may be employed. By forming multiple dice in the same package, a number of advantages compared to traditional techniques (e.g., wire-bonding or flip-chip packing) may be realized. First, the electrical response time is faster because all dice are integrated in the same package, having shorter connection lengths. Second, the process is low cost because gold wires in wire-bonding are expensive and the ball attachment process may be complicated. Third, the resulting package occupies much less space, in terms of both area and height. Fourth, the reliability may be increased because there are no problems to address the wire bonding shorting issue.

Figure 1:
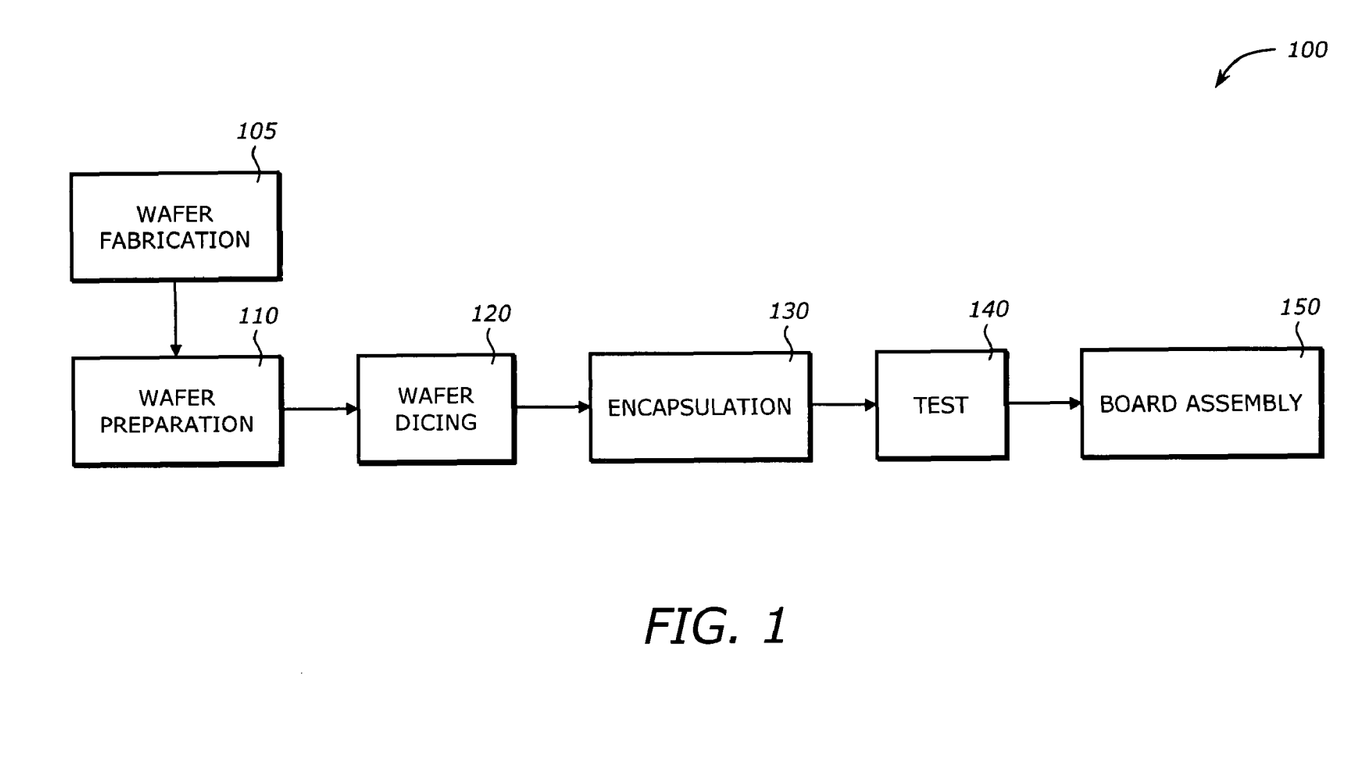
FIG. 1 is a diagram illustrating a manufacturing process in which one embodiment of the invention can be practiced.

FIG. 1 is a diagram illustrating a system 100 in which one embodiment of the invention can be practiced. The system 100 includes a wafer fabrication phase 105, wafer preparation phase 110, a wafer dicing phase 120, an encapsulation phase 130, a testing phase 140, and a board assembly phase 150. The system 100 represents a manufacturing flow of a semiconductor packaging process.

The wafer fabrication phase 105 fabricates the wafer containing a number of dice. The individual dice may be any microelectronic devices such as microprocessors, memory devices, interface circuits, etc. The wafer fabrication phase 105 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material.

The wafer preparation phase 110 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 120 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The encapsulation phase 130 encapsulates the dice and the substrate layers. The dice may be homogeneous or heterogeneous. A number of dices are interconnected using copper plating. Integrated heat spreader (IHS) may be attached to the die and substrate assembly. The encapsulated assembly of the dice and substrate layers becomes a package ready to be tested.

The testing phase 140 performs one or more tests on the package under various conditions. The test may be highly accelerated stress test (HAST) or biased-HAST. The package may be powered or non-powered. The testing phase 140 may be optional.

The board assembly phase 150 assembles the package into a printed circuit board. This phase attaches the multi-die package to the board. This phase may include various soldering processes, reflow, testing, and inspection. The assembled board is then installed into a platform in a system or unit.

Figure 2:
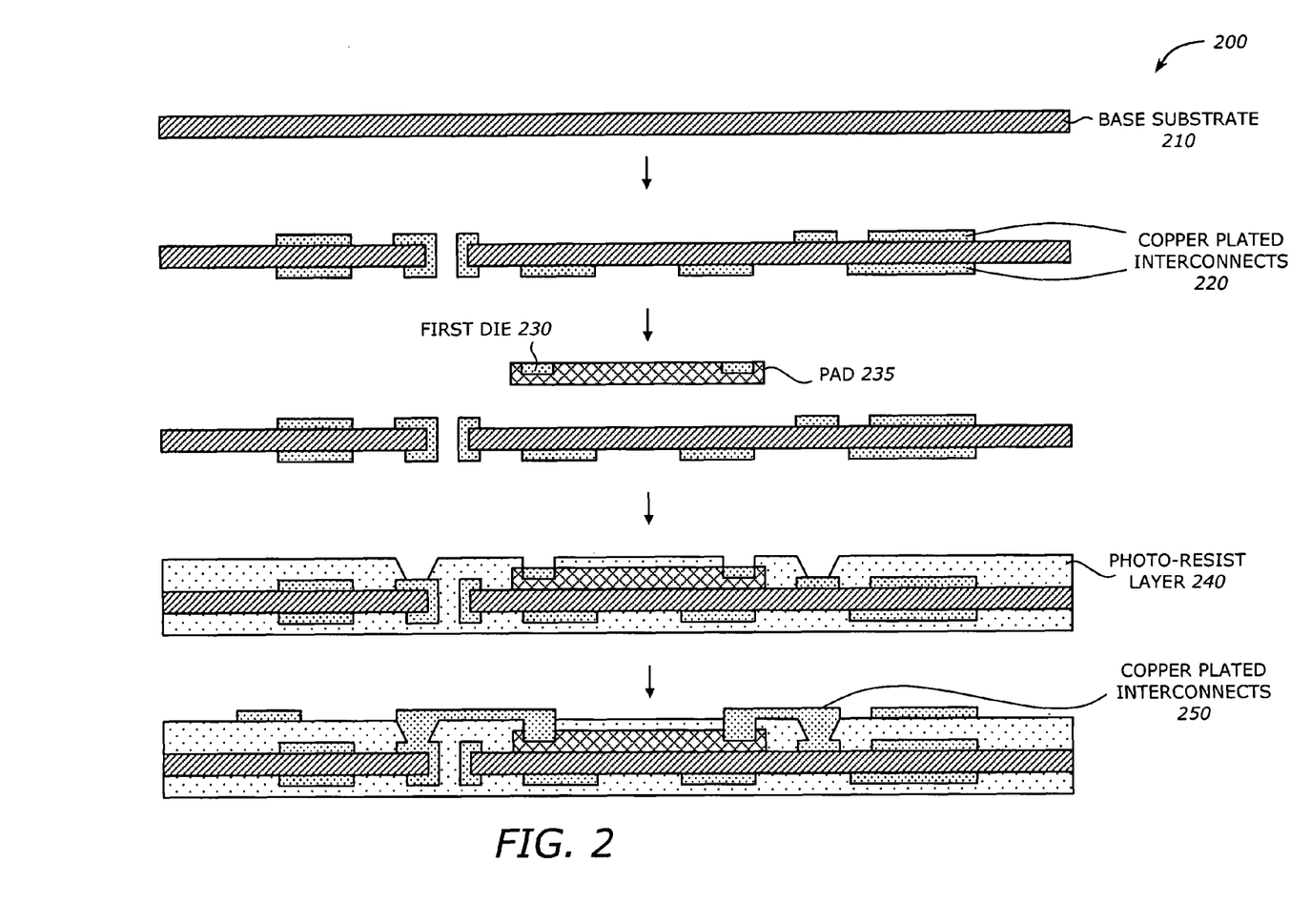
FIG. 2 is a diagram illustrating a process to form a first layer according to one embodiment of the invention.

FIG. 2 is a diagram illustrating a process 200 to form a first layer according to one embodiment of the invention.

The process 200 starts with a base substrate 210. The substrate 210 is typically a dielectric layer of suitable dielectric material such as bizmaleimide trazine (BT). The base substrate 210 provides support for the dice and appropriate routing to external contacts. The base substrate 210 is then drilled and copper plated according to an interconnection pattern. The copper form copper plated interconnects 220 that provide conductive paths to contact points. A first die 230 is then attached to the copper plated base substrate 210. The attachment may be performed by applying an adhesive on the die area and pressing the die on the adhesive with some force. The first die 210 may have some die pads 235.

After die attachment, a photo-resist layer 240 made by a dielectric material is deposited or coated on the surface of the copper plated substrate 210 and the first die 210. A photo-resist development process is then performed using standard techniques to etch the photo-resist layer 240 and expose the contact points such as some of the copper plated interconnects 220 and the die pads 235 as openings. Then, copper plated interconnects 250 are deposited to the openings for substrate and die interconnections.

Figure 3:
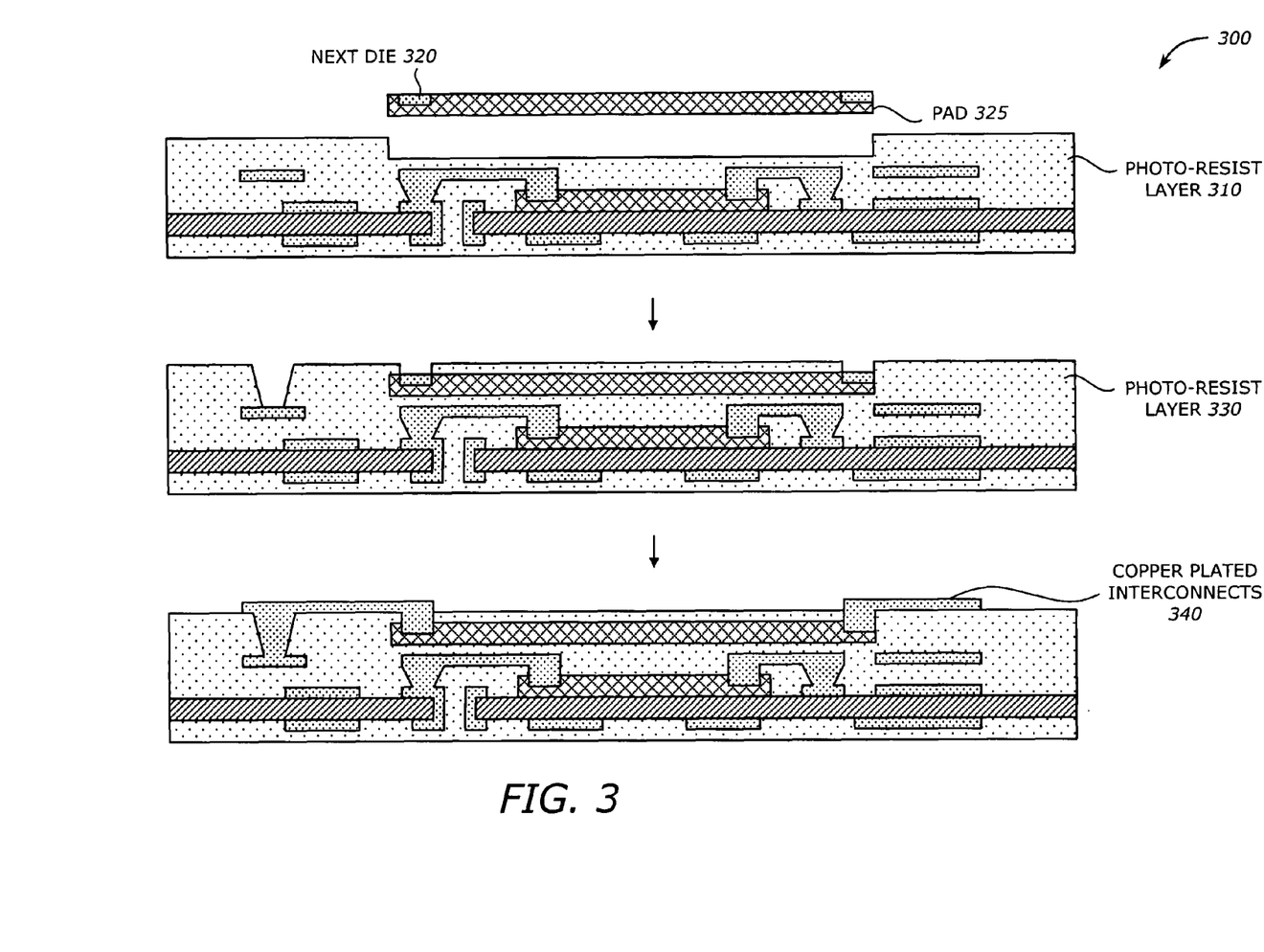
FIG. 3 is a diagram illustrating a process to form a next layer according to one embodiment of the invention.

FIG. 3 is a diagram illustrating a process 300 to form a next layer according to one embodiment of the invention.

From the first layer as constructed in FIG. 2, a photo-resist layer 310 of dielectric material is deposited or coated on the first layer. A photo-resist development process is then performed using standard techniques to etch the photo-resist layer 310 to have a trench or a recess for a next die 320. The next die 320 having die pads 325 is then attached to the developed photo-resist layer 310 at the trench area. The attachment is performed with standard techniques such as using a suitable adhesive as in the first layer.

Then, a photo-resist layer 330 is deposited or coated on the developed photo-resist layer 310 and the next die 320. The layer 330 is developed to expose the interconnect points and the die pads 325. Copper plating is then performed to provide copper plated interconnects 340 for substrate and die interconnections.

Figure 4A:
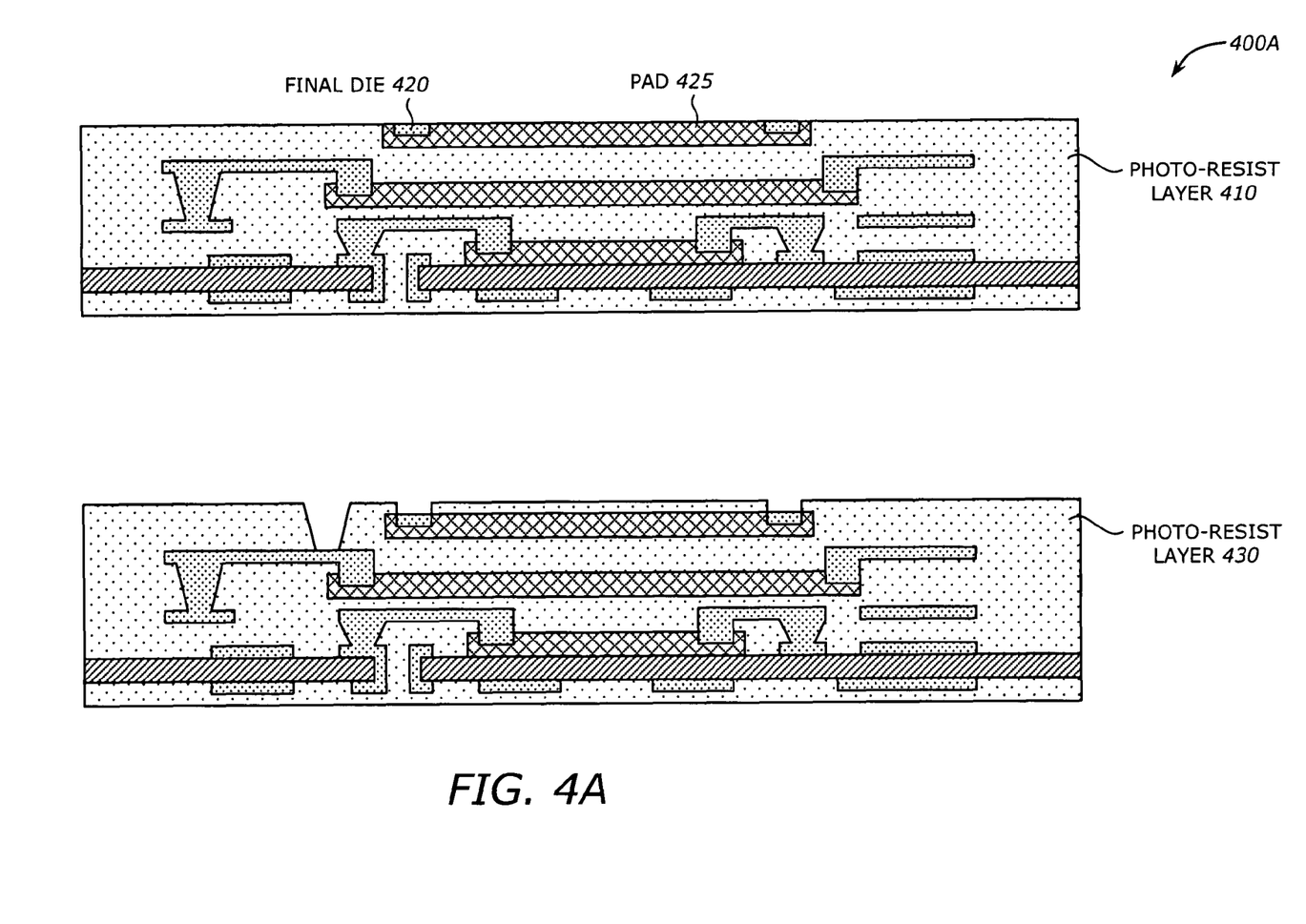
FIG. 4A is a diagram illustrating a first part of a process to form a final layer according to one embodiment of the invention.

FIG. 4A is a diagram illustrating a first part of a process 400 to form a final layer according to one embodiment of the invention. The process 400 repeats most of the procedures shown in FIG. 3 except that there is a final operation discussed below.

A photo-resist layer 410 of a dielectric material is deposited or coated on the previous layer. The layer 410 is then developed to expose a trench or recess area. A final die 420 having die pads 425 is then attached to the layer 410 at the trench area using standard techniques as discussed above.

Then, a photo-resist layer 430 is deposited or coated on the developed photo-resist layer 410 and the final die 420. The layer 430 is developed to expose the interconnect points and the die pads 425. Copper plating is then performed to provide copper plated interconnects 440 for substrate and die interconnections.

Figure 4B:
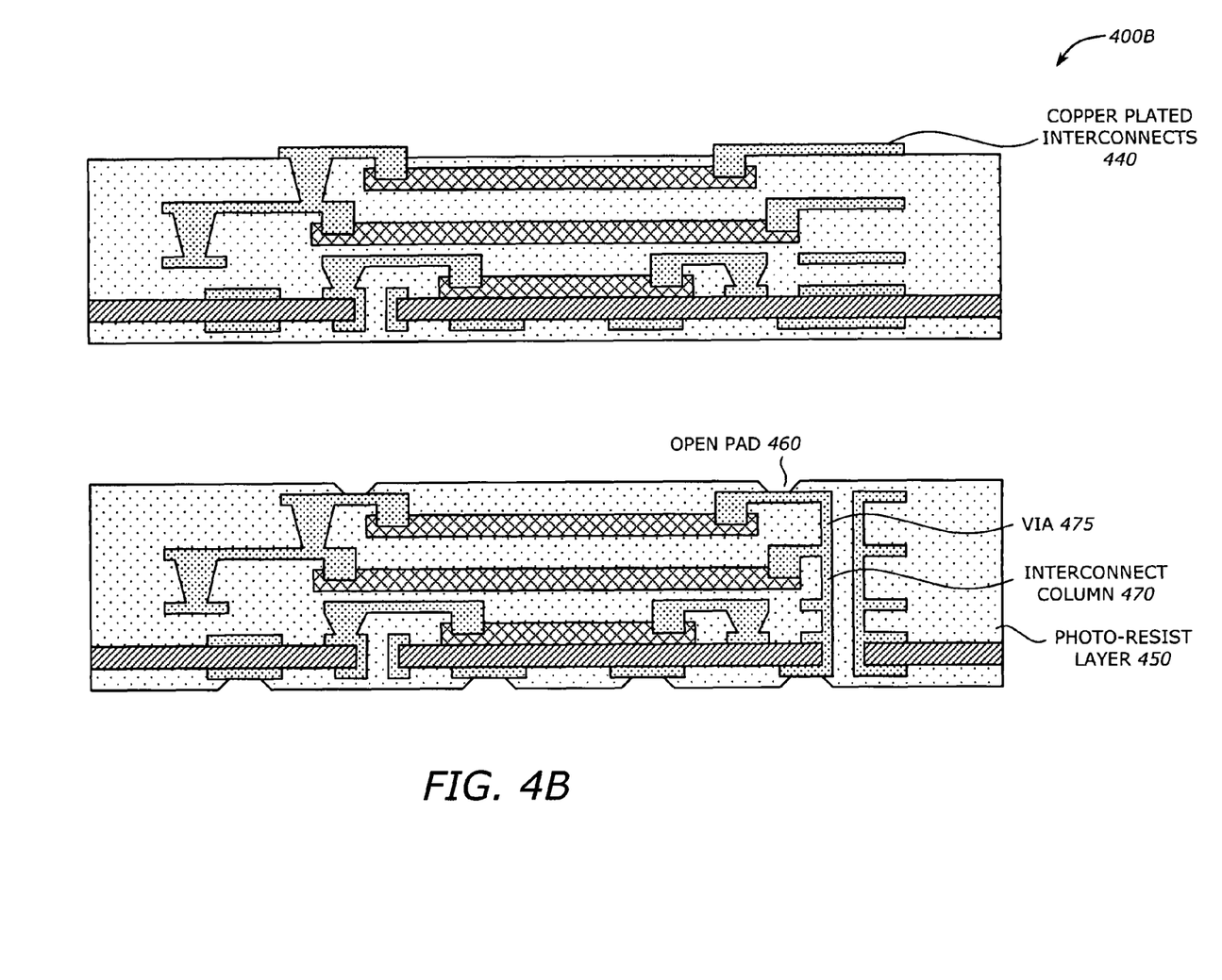
FIG. 4B is a diagram illustrating a second part of a process to form a final layer according to one embodiment of the invention.

FIG. 4B is a diagram illustrating a second part of a process 400 to form a final layer according to one embodiment of the invention.

A final operation is then performed. A final interconnect column 470 is performed to connect all the unconnected copper plated interconnects to connect the dice together. The column 470 may include vias 475 filled up with copper. A photo-resist layer 450 is deposited or coated on the developed layer 430 and the copper plated interconnects 440. The layer 450 is then developed to etch open pads 460 for attachment the package to another component or the printed circuit board.

The final operation may be performed on the final layer. This final layer may be any layer after the first layer. In case it is the second layer, then the process described in FIG. 3 may be replaced by the process shown in FIG. 4, or alternatively it may include the additional final operation as described above.

Figure 5:
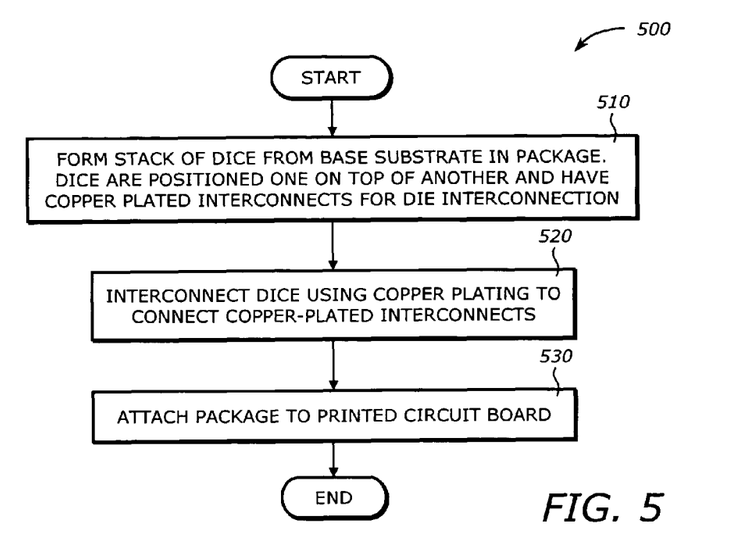
FIG. 5 is a flowchart illustrating a process to construct a multi-die package according to one embodiment of the invention.

FIG. 5 is a flowchart illustrating a process 500 to construct a multi-die package according to one embodiment of the invention.

Upon START, the process 500 forms a stack of dice from a base substrate in a package (Block 510). The dice are positioned one on top of another and have copper plated interconnects for die interconnection. Next, the process 500 interconnects the dice using copper plating to connect the copper plated interconnects (Block 520). Then, the process 500 attaches the package to a printed circuit board or another component (Block 530). The process 500 is then terminated.

Figure 6:
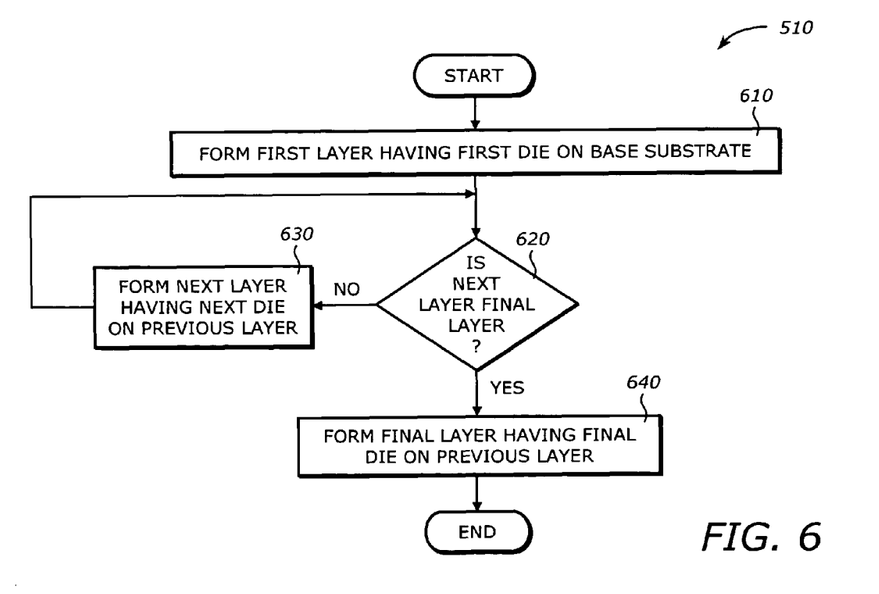
FIG. 6 is a flowchart illustrating a process to form a stack of dice according to one embodiment of the invention.

FIG. 6 is a flowchart illustrating the process 510 shown in FIG. 5 to form a stack of dice according to one embodiment of the invention.

Upon START, the process 510 forms a first layer having a first die on a base substrate (Block 610). Next, the process 510 determines if the next layer is the final layer (Block 620). If not, the process 510 forms a next layer having a next die on the previous layer (Block 630) and then returns to Block 620. Otherwise, the process 510 forms a final layer having a final die on the previous layer (Block 640). The process 510 is then terminated.

Figure 7:
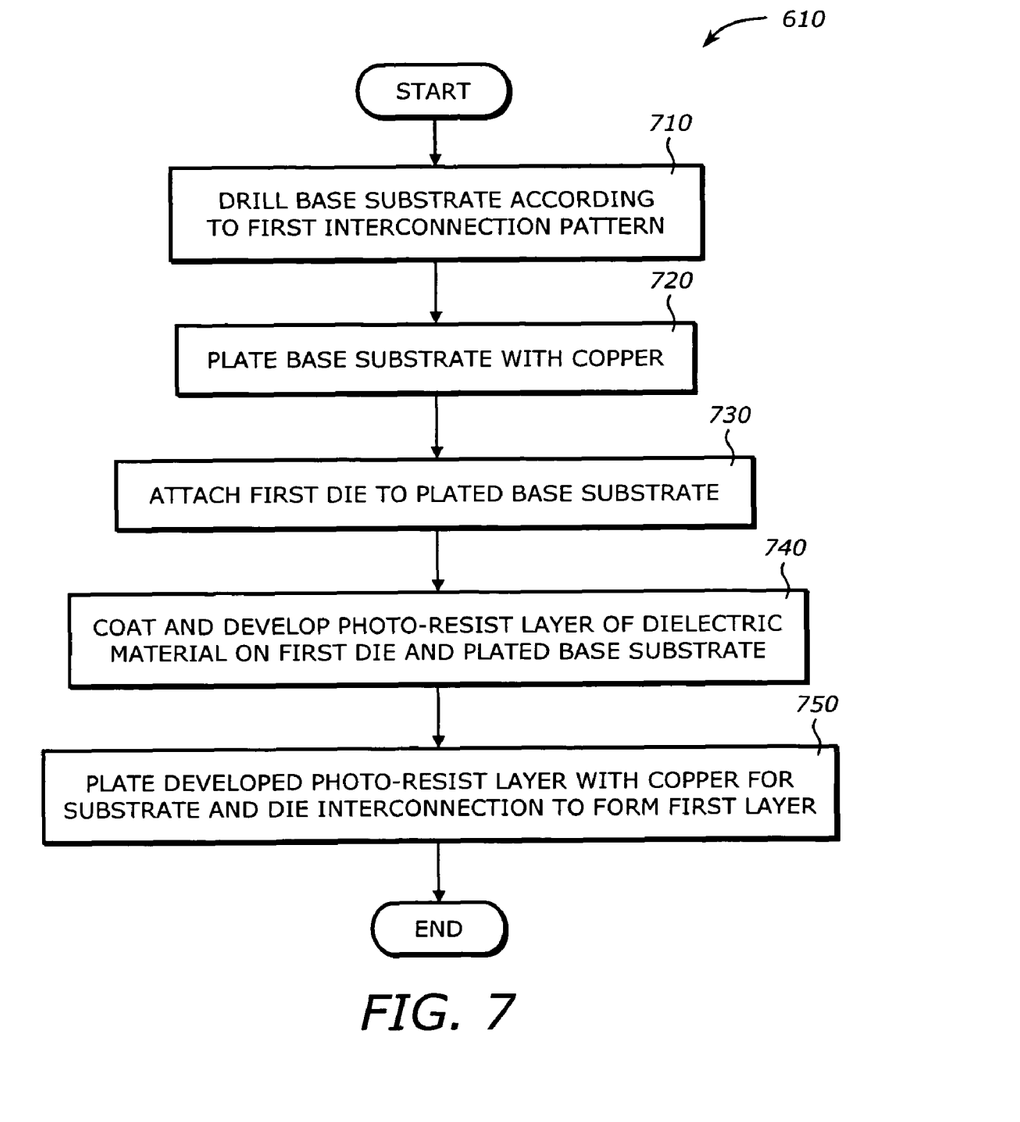
FIG. 7 is a flowchart illustrating a process to form a first layer according to one embodiment of the invention.

FIG. 7 is a flowchart illustrating the process 610 to form a first layer according to one embodiment of the invention.

Upon START, the process 610 drills the base substrate according to a first interconnection pattern (Block 710). Then, the process 610 plates the base substrate with copper (Block 720). Next, the process 610 attaches the first die to the plated base substrate (Block 730). Then, the process 610 coats and develops a photo-resist layer of a dielectric material on the first die and the plated base substrate (Block 740). Next, the process 610 plates the developed photo-resist layer with copper for substrate and die interconnection to form the first layer (Block 750). The process 610 is then terminated.

Figure 8:
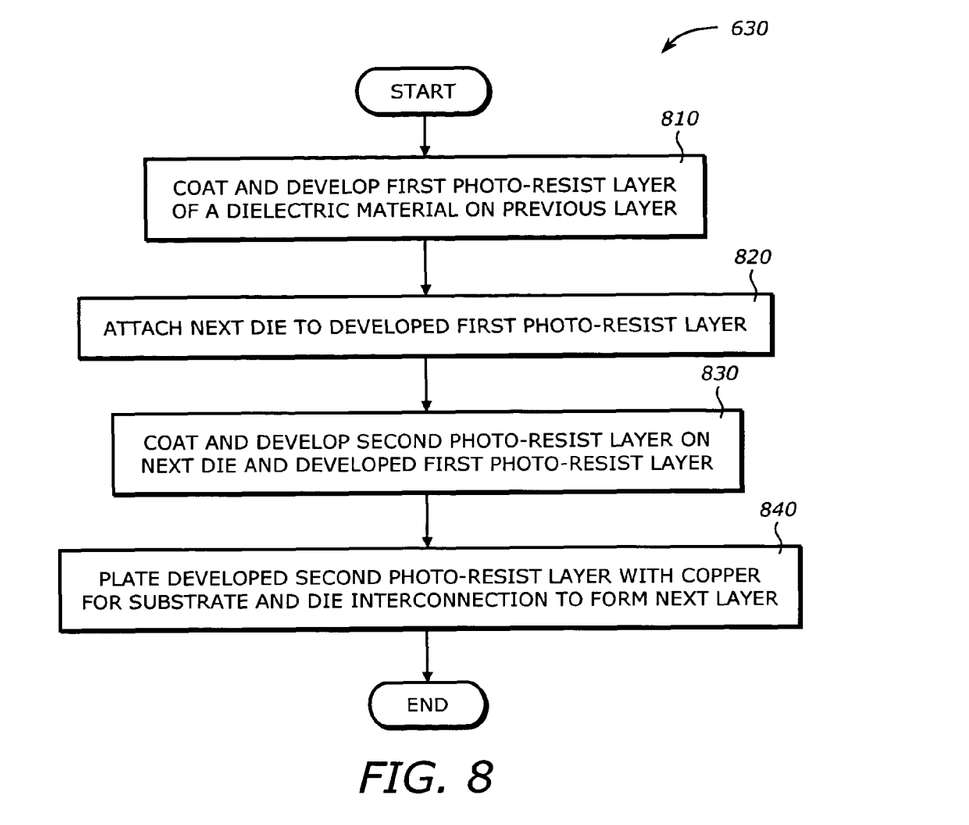
FIG. 8 is a flowchart illustrating a process to form a next layer according to one embodiment of the invention.

FIG. 8 is a flowchart illustrating the process 630 to form a next layer according to one embodiment of the invention.

Upon START, the process 630 coats and develops a first photo-resist layer of a dielectric material on a previous layer (Block 810). If the next layer is the second layer, then the previous layer is the first layer. Otherwise, it is a previously formed layer. Next, the process 630 attaches the next die to the developed first photo-resist layer (Block 820). Then, the process 630 coats and develops a second photo-resist layer on the next die and the developed first photo-resist layer (Block 830). Next, the process 630 plates the developed second photo-resist layer with copper for substrate and die interconnection to form the next layer (Block 840). The process 630 is then terminated.

Figure 9:
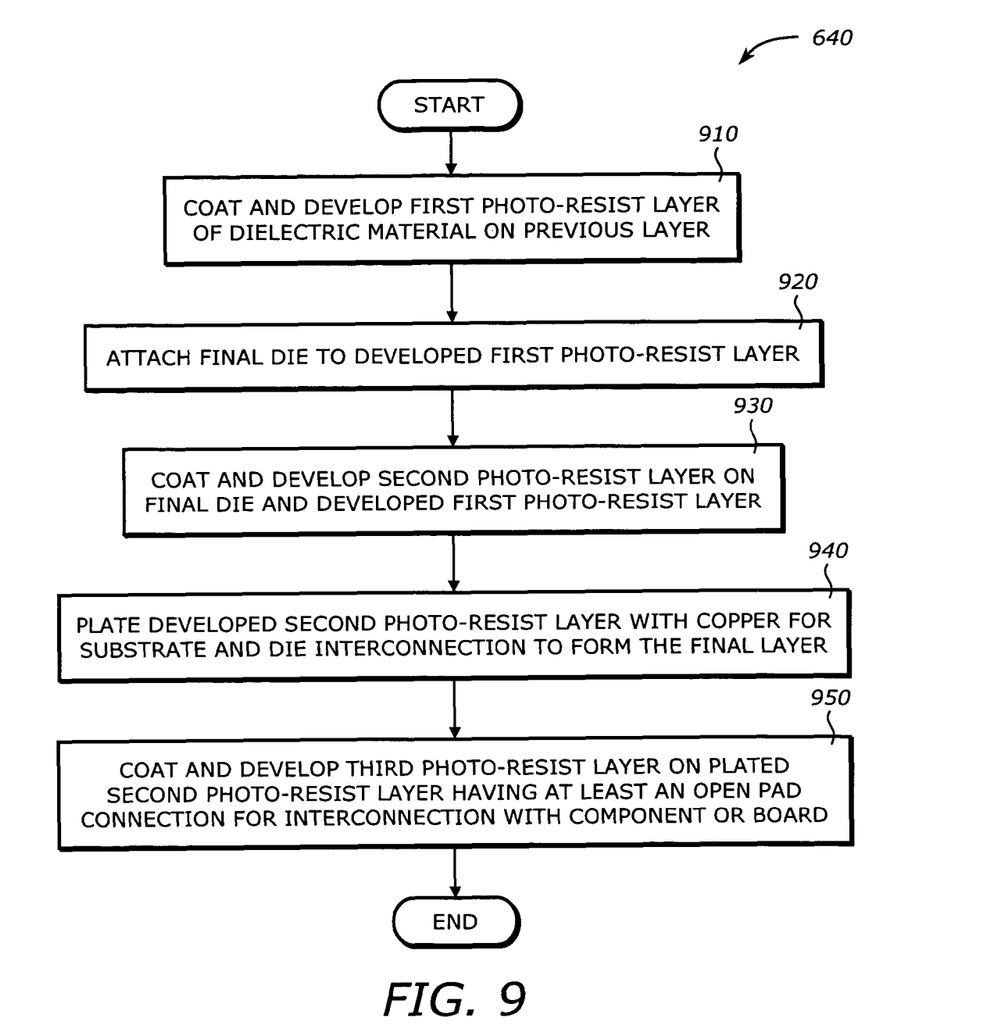
FIG. 9 is a flowchart illustrating a process to form a final layer according to one embodiment of the invention.

FIG. 9 is a flowchart illustrating the process 640 to form a final layer according to one embodiment of the invention.

Upon START, the process 640 coats and develops a first photo-resist layer of a dielectric material on a previous layer (Block 910). The previous layer may be the first layer if the final layer is the second layer. Otherwise, the previous layer is the previously formed layer. Then, the process 640 attaches the final die to the developed first photo-resist layer (Block 920). Next, the process 640 coats and develops a second photo-resist layer on the final die and the developed first photo-resist layer (Block 930). Then, the process 640 plates the developed second photo-resist layer with copper for substrate and die interconnection to form the final layer (Block 940). Next, the process 640 coats and develops a third photo-resist layer on the plated second photo-resist layer having at least an open pad connection for interconnection with a component or a board (Block 950) and is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    forming a first layer having a first die on a base substrate in a package;
    forming a next layer having a next die on the first layer, the dice having copper plated interconnects for die interconnection, wherein the copper plated interconnects are directly attached to the die;
    interconnecting the dice using a substantially vertical interconnecting column comprising copper plating to connect the copper plated interconnects;
    forming a first photo-resist layer of a dielectric material on the next layer;
    attaching a final die to the first photo-resist layer;
    forming a second photo-resist layer on the final die and the first photo-resist layer;
    forming copper on the second photo-resist layer for substrate and die interconnection; and
    forming a third photo-resist layer on the second photo-resist layer having at least an open pad connection for interconnection with a component or a board.

2. The method of claim 1 wherein forming the first layer comprises:
    drilling the base substrate according to a first interconnection pattern;
    plating the base substrate with copper;
    attaching the first die to the plated base substrate;
    coating and developing a photo-resist layer of a dielectric material on the first die and the plated base substrate; and
    plating the developed photo-resist layer with copper for substrate and die interconnection to form the first layer.

3. The method of claim 1 wherein forming the next layer comprises:
    coating and developing a first photo-resist layer of a dielectric material on a previous layer;
    attaching the next die to the developed first photo-resist layer;
    coating and developing a second photo-resist layer on the next die and the developed first photo-resist layer; and
    plating the developed second photo-resist layer with copper for substrate and die interconnection to form the next layer.

4. The method of claim 1 wherein interconnecting further comprises:
    forming substantially vertical vias on the copper plate interconnects; and filling the substantially vertical vias with copper to connect the copper plate interconnects.

5. A method comprising:
    forming a first layer having a first die on a base substrate in a package;
    forming a next layer having a next die on the first layer, the dice having copper plated interconnects for die interconnection, wherein the copper plated interconnects are directly attached to the die;
    interconnecting the dice using a substantially vertical interconnecting column comprising copper plating to connect the copper plated interconnects;
    coating and developing a first photo-resist layer of a dielectric material on a previous layer;
    attaching the final die to the developed first photo-resist layer;
    coating and developing a second photo-resist layer on the final die and the developed first photo-resist layer;
    plating the developed second photo-resist layer with copper for substrate and die interconnection to form the final layer; and
    coating and developing a third photo-resist layer on the plated second photo-resist layer having at least an open pad connection for interconnection with a component or a board.

* * * * *